United States Patent
Park et al.

(10) Patent No.: US 6,835,954 B2
(45) Date of Patent: Dec. 28, 2004

(54) ACTIVE MATRIX ORGANIC ELECTROLUMINESCENT DISPLAY DEVICE

(75) Inventors: Jae-Yong Park, Annyang-si (KR); Joon-Kyu Park, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 7 days.

(21) Appl. No.: 10/330,128

(22) Filed: Dec. 30, 2002

(65) Prior Publication Data

US 2003/0127652 A1 Jul. 10, 2003

(30) Foreign Application Priority Data

Dec. 29, 2001 (KR) .......................................... 2001-88538
Jun. 3, 2002 (KR) ................................. 10-2002-0031045

(51) Int. Cl.⁷ .......................... H01L 29/15; H01L 29/04
(52) U.S. Cl. .............................. 257/72; 257/59; 257/57
(58) Field of Search ............................ 257/72, 59, 57

(56) References Cited

U.S. PATENT DOCUMENTS 6,489,631 B2 * 12/2002 Young et al. .................. 257/59
6,696,105 B2 * 2/2004 Hiroki et al. ............... 427/466

FOREIGN PATENT DOCUMENTS

JP 2001-267086 9/2001

* cited by examiner

Primary Examiner—Amir Zarabian
Assistant Examiner—Kiesha Rose
(74) Attorney, Agent, or Firm—McKenna Long & Aldridge LLP

(57) ABSTRACT

An active matrix organic electroluminescent display device of the present invention is fabricated through a six-mask process unlike the related art that uses eight masks. In the present invention, since the ground line and the power line are entirely or over substantially disposed above the substrate, the resistance of the power line is reduced and thermal damage that may occur in the power line during driving the device is prevented. Therefore, the image quality increases and the uniformity in the display can be obtained. Furthermore, due to the reduction of the mask process, the occurrence of defects is reduced and the production yield can be raised. Additionally, the principle of the present invention can be applied to either the top emission type organic electroluminescent display device or the bottom emission type organic electroluminescent display device. When it is utilized for the top emission type, the active matrix organic electroluminescent display device can have a high aperture ratio.

25 Claims, 12 Drawing Sheets

US 6,835,954 B2

ACTIVE MATRIX ORGANIC ELECTROLUMINESCENT DISPLAY DEVICE

This application claims the benefit of Korean Patent Application Nos. 2001-0088538 filed on Dec. 29, 2001 and 2002-031045 filed on Jun. 3, 2002, which are hereby incorporated by reference in their entirety for all purposes as if fully set forth herein.

BACKGROUND OF THE INVENTION

1. Field of the Invention

The present invention relates to organic electroluminescent display devices, and more particularly, to an active matrix electroluminescent display devices having thin film transistors.

2. Discussion of the Related Art

As an information age has been evolved rapidly, a necessity for flat panel display, which has advantages such as thinness, lightweight and lower power consumption, has been increased. Accordingly, various flat panel display (FPD) devices such as liquid crystal display (LCD) devices, plasma display panels (PDPs), field emission display (FED) devices and electroluminescence display (ELD) devices have been researched and developed by now.

Among many kinds of FPD devices, the electroluminescence display (ELD) device makes use of electroluminescence phenomenon in which light is generated when an electric field of certain intensity is applied to a fluorescent substance. The electro luminescence display (ELD) devices can be classified into inorganic electroluminescence display (ELD) device and organic electroluminescent display (ELD) device depending on a source that excites careers. The organic electroluminescent display (ELD) device has drawn attention as a displaying device for natural colors because it can display every color in a range of a visible light and has a high brightness and a low operating voltage.

In addition, because the organic electroluminescence display (ELD) device is a self-luminescent, it has a high contrast ratio and is suitable for an ultra-thin type display device. Moreover, because it has a simple manufacturing process, the degree of environmental contamination is relatively low. Besides, the organic electroluminescence display (ELD) device has a few microseconds (μs) response time so that it is suitable for displaying moving images. The organic electroluminescence display (ELD) device has no limit in a viewing angle and is stable in low temperature condition. Because it is driven with a relatively low voltage between 5V and 15V, a manufacturing and design of a driving circuit is easy.

A structure of the organic electroluminescent display (ELD) device is similar to that of the inorganic electroluminescence display (ELD) device but a light-emitting theory is different from that of the inorganic electroluminescence display (ELD) device. That is, the organic electroluminescent display (ELD) device emits light by a recombination of an electron and a hole and thus it is often referred to as an organic light emitting diode (OLED).

Recently, active matrix type in which a plurality of pixels is arranged in a matrix form and a thin film transistor is connected thereto has been widely applied to the flat panel display devices. The active matrix type is also applied to the organic electroluminescent display (ELD) device, and this is referred to as an active matrix organic electroluminescent display (ELD) device.

FIG. 1 is an equivalent circuit diagram showing a basic pixel structure of a related art active matrix organic electroluminescent display (ELD) device.

In FIG. 1, a pixel of the active matrix organic electroluminescent display device has a switching thin film transistor 4, a driving thin film transistor 5, a storage capacitor 6 and a light emitting diode (LED) 7. The switching thin film transistor 4 and the driving thin film transistor 5 are comprised of p-type polycrystalline silicon thin film transistor. A gate electrode of the switching thin film transistor 4 is connected to the gate line 1, and a source electrode of the switching thin film transistor 4 is connected to the data line 2. A drain electrode of the switching thin film transistor 4 is connected to a gate electrode of the driving thin film transistor 5, and a drain electrode of the driving thin film transistor 5 is connected to an anode electrode of the light emitting diode (LED) 7. A cathode electrode of the light emitting diode (LED) 7 is grounded. A source electrode of the driving thin film transistor 5 is connected to a power line 3, and a storage capacitor 6 is connected to the gate electrode and the source electrode of the driving thin film transistor 5.

In the pixel structure illustrated in FIG. 1, if a scanning signal is applied to the gate line 1, the switching thin film transistor 4 is turned on, and an image signal from the data line 2 is stored into the storage capacitor 6 through the switching thin film transistor 4. If the image signal is applied to the gate electrode of the driving thin film transistor 5, the driving thin film transistor 5 is turned on, and thus the light emitting diode (LED) 7 emits light. A luminance of the light emitting diode (LED) 7 is controlled by varying electric current in the light emitting diode (LED) 7. The storage capacitor 6 keeps a gate voltage of the driving thin film transistor 5 constant while the switching thin film transistor 4 is turned off. That is, because the driving thin film transistor 5 can be driven by a stored voltage in the storage capacitor 6 even when the switch thin film transistor 4 is turned off, the electric current can keep flowing into the light emitting diode (LED) 7 and thus the light emitting diode (LED) emits light until a next image signal comes in.

FIG. 2 is a schematic cross-sectional view of a related art active matrix organic electroluminescent display device. FIG. 2 illustrates an organic light emitting diode, a storage capacitor and a driving thin film transistor. Moreover, a bottom emission type, in which light is emitted through an anode of a lower electrode, is adopted.

In FIG. 2, a buffer layer 11 is formed on a substrate, and then a first polycrystalline silicon layer having first to third portions 12a, 12b and 12c and a second polycrystalline silicon layer 13a are formed on the buffer layer 11. The first polycrystalline silicon layer is divided into the first portion 12a (i.e., an active region) where impurities are not doped and the second and third portions 12b and 12c (i.e., respectively, a drain region and a source region) where the impurities are doped. The second polycrystalline silicon layer 13a becomes one of the capacitor electrodes. A gate insulation layer 14 is disposed on the active region 12a and a gate electrode 15 is disposed on the gate insulation layer 14. A first interlayer insulator 16 is formed on the gate electrode 15 and on the gate insulation layer 14 while covering the drain and source regions 12b and 12c and the second polycrystalline silicon layer 13a. A power line 17 is disposed on the first interlayer insulator 16 particularly above the second polycrystalline silicon layer 13a (i.e., the capacitor electrode). Although not shown in FIG. 2, the power line 17 extends as a line in one direction. The power line 17 and the second polycrystalline silicon layer 13a form a storage capacitor with the first interlayer insulator 16 therebetween. On the first interlayer insulator 16, a second interlayer insulator 18 is formed while covering the power line 17.

Meanwhile, first and second contact holes 18a and 18b, which penetrate both the first and second interlayer insulators 16 and 18, expose the drain region 12b and source region 12c, respectively. Additionally, a third contact hole 18c, which penetrates the second interlayer insulator 18, is formed and exposes a portion of the power line 17. A drain electrode 19a and a source electrode 19b are formed on the second interlayer insulator 18. The drain electrode 19a contacts the drain region 12b through the first contact hole 18a. The source electrode 19b contacts both the source region 12c and the power line 17 through the second contact hole 18b and through the third contact hole 18c, respectively. A first passivation layer 20 is formed on the drain and source electrodes 19a and 19b and on the exposed portions of the second interlayer insulator 18. The first passivation layer 20 has a fourth contact hole 20a that exposes a portion of the drain electrode 19a. An anode electrode 21 that is made of a transparent conductive material is disposed on the first passivation layer 20 and contacts the drain electrode 19a through the fourth contact hole 20a. A second passivation layer 22 is formed on the anode electrode 21 and on the exposed portions of the first passivation layer 20. The second passivation layer 22 has a well 22a that exposes a portion of the anode electrode 21. An electroluminescent layer 23 is formed on the second passivation layer 22 and into the well 22a. A cathode electrode 24 is formed entirely on the exposed portions of the second passivation layer 22 and on the electroluminescent layer 23. The cathode electrode 24 is formed of an opaque metallic conductive material.

In the active matrix organic electroluminescent display device shown in FIG. 2, the anode electrode 21 is formed of the transparent conductive material, while the cathode electrode 24 is formed of the opaque conductive material. Thus, the light emitted from the organic electroluminescent layer 23 is released in a bottom direction, which is called the bottom emission type.

FIGS. 3A to 3I are cross-sectional views showing fabricating process of an active matrix organic electro luminescent display device of FIG. 2. A lot of patterns shown in FIGS. 3A to 3G are formed through a photolithography process of photoresist (PR) coating, aligning, exposing and developing steps using a mask.

In FIG. 3A, after a buffer layer 11 is formed on an entire surface of a substrate 10, first and second semiconductor layers 12 and 13 of polycrystalline silicon are formed on the buffer layer 11 through a first mask process. The first and second polycrystalline semiconductor layers 12 and 13 have island shapes.

In FIG. 3B, an insulator of silicon nitride or silicon oxide and a conductive material of metal are sequentially deposited on the first polycrystalline silicon layer 12 and then patterned using a second mask, thereby sequentially forming a gate insulation layer 12 and a gate electrode 15 on the first polycrystalline semiconductor layer 12. Thereafter, impurities such as p-type ions are doped on the exposed portions of the first and second polycrystalline semiconductor layers 12 and 13. During doping, since the gate electrode 15 acts as a mask, the first polycrystalline semiconductor layer 12 is divided into an active region 12a where the impurities are not doped and drain and source regions 12b and 12c where the impurities are doped. Further, the second polycrystalline semiconductor layer 13 on which the impurities are fully doped becomes a capacitor electrode 13a. The drain and source regions 12b and 12c are located on both sides of the active region 12a.

Referring to FIG. 3C, a first interlayer insulator 16 is formed on the entire surface of the buffer layer 11 to cover the gate electrode 15, the drain and source regions 12b and 12c, and the capacitor electrode 13a. After forming the first interlayer insulator 16 over the entire surface of the substrate 10, a power line 17 of metal is formed through a third mask process on the first interlayer insulator 16 particularly to overlap the capacitor electrode 13a. Since the power line 17 is formed right above the capacitor electrode 13a, it forms a storage capacitor with the capacitor electrode 13a and with the interposed first interlayer insulator 16.

In FIG. 3D, a second interlayer insulator 18 is formed on the first interlayer insulator 16 and on the power line 17. Thereafter, first to third contact holes 18a, 18b and 18c are formed using a fourth mask process. The first contact hole 18a exposes the drain region 12b; the second contact hole 18b exposes the source region 12c; and the third contact hole 18c exposes the power line 17.

In FIG. 3E, a metal layer is formed on the second passivation layer 18 and then patterned through a fifth mask process, thereby forming a drain electrode 19a and a source electrode 19b. The drain electrode 19a contacts the drain region 12b through the first contact hole 18a, while the source electrode 19b contacts the source region 12c through the second contact hole 18b. Furthermore, the source electrode 19b contacts the power line 17 through the third contact hole 18c.

Through the previous process, a driving thin film transistor having the semiconductor layer 12, the gate electrode 15, the drain and source electrodes 19a and 19b is completed. Moreover, a region corresponding to the power line 17 and the capacitor electrode 13a forms the storage capacitor. Although not shown in FIG. 3E, but shown in FIG. 1, the storage electrode 13 is connected to the gate electrode 15 of the driving thin film transistor and the power line 17 is parallel to the signal line.

In FIG. 3F, a first passivation layer 20 having a fourth contact hole 20a resulting from a sixth mask process is formed on the second interlayer insulator while covering the drain and source electrodes 19a and 19b. The fourth contact hole 20a exposes a portion of the drain electrode 19a.

In FIG. 3G, a transparent conductive material is deposited on the first passivation layer 20 and then patterned using a seventh mask process, thereby forming an anode electrode 21 that contacts the drain electrode 19a through the fourth contact hole 20a.

In FIG. 3H, a second passivation layer 22 is formed on the anode electrode 21 and on the exposed portion of the first passivation layer 20. Thereafter, the second passivation layer 22 is patterned using an eighth mask process, thereby forming a well 22a that exposes a portion of the anode electrode 21.

Now in FIG. 3I, an organic electroluminescent layer 23 is formed on the second passivation layer to contact the anode electrode 21 through the well 22a. Thereafter, a cathode electrode 24 is formed on the organic electroluminescent layer 23 and on the exposed portion of the second passivation layer 22. The cathode electrode 24 entirely covers the substrate 10.

In the above-mentioned processes forming the organic electroluminescent display device, a plurality of thin film depositions are repeated, and moreover a plurality of photolithography processes that use the masks are also repeated many times. Therefore, these repetitions increase the mask process. Since the photolithography process includes a rinsing process, a photoresist deposition process, an exposure process, a developing process, an etching process, etc., the manufacturing time and the cost of production will be reduced if only one mask process is omitted. The organic electroluminescent display device described with reference to FIGS. 3A to 3I, however, requires eight masks, and thus, it decreases the production yield and increases the cost of production. Moreover, the more masks the organic electroluminescent display device requires, the more defects the fabrication process creates.

Additionally, since the active matrix organic electroluminescent display device of the related art has the capacitor electrode that is the opaque material, it has a decreased luminescent area and a reduced aperture ratio. In order to overcome these problems, the current density should be raised to increase the luminance of the device, thereby causing a decrease in the lifetime of the organic electroluminescent display device.

Furthermore, since the organic electroluminescent display device of the related art has the power line in a shape of line, the power line is easily deteriorated and damaged and the active matrix organic electroluminescent display device do not display the images uniformly.

On the other hand, as stated above, the active region, which is generally called an active layer, is formed through processes of forming a polycrystalline silicon layer over the substrate and patterning the polycrystalline silicon layer. Since the polycrystalline silicon layer includes grains and grain boundaries having different etching selectivity, the polycrystalline silicon layer may be over-etched in order to etch all the grains and the grain boundaries that should be removed. In the over-etching process, a part of the buffer layer, which is exposed by the removed polycrystalline silicon layer, may be etched, so that when the polycrystalline silicon layer is completely patterned, crystalline shapes may be formed on the surface of the buffer layer. The crystalline shapes have an influence on other layers to be formed on the buffer layer, for example, the gate insulation layer and the interlayer insulator, and thus the anode electrode, which is formed on the layers and is made of indium-tin-oxide, has a surface with poor roughness.

A non-uniform field is induced between the anode electrode and the cathode electrode due to the surface roughness, and this results in the decreasing lifetime of the organic electroluminescent display device. Furthermore, since a rectifying ratio is not good because of the surface roughness of the buffer layer, it is difficult to display images of high gray scale.

SUMMARY OF THE INVENTION

Accordingly, the present invention is directed to an active matrix organic electroluminescent display device and a fabricating method of the same that substantially obviates one or more of problems due to limitations and disadvantages of the related art.

An advantage of the present invention is to provide an active matrix organic electroluminescent display device of low fabrication cost and high production yield by reducing the number of mask processes.

Another advantage of the present invention is to provide an active matrix organic electroluminescent display device and a fabricating method of the same, which has a high aperture ratio and a long lifetime.

Another advantage of the present invention is to provide an active matrix organic electroluminescent display device, which prevents deterioration and damage of a power line and displays uniform images.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescent display device includes a substrate; a ground layer on the substrate; a buffer layer on the ground layer; a polycrystalline semiconductor layer on the buffer layer, the polycrystalline semiconductor layer having an active region, a drain region and a source region, wherein the active region is disposed in the middle of the polycrystalline silicon layer and the drain and source regions are disposed in both sides of the active region; a gate insulation layer on the buffer layer to cover the polycrystalline silicon layer; a gate electrode on the gate insulation layer, the gate electrode disposed right above the active region of the polycrystalline silicon layer; a first capacitor electrode on the gate insulation layer; an interlayer insulator formed on the gate insulation layer to cover the gate electrode and the first capacitor electrode; drain and source electrodes on the interlayer insulator, the drain and source electrode contacting the drain and source regions, respectively, through first and second contact holes that penetrate the interlayer insulator and the gate insulation layer; a cathode electrode formed on the interlayer insulator and connected to the drain electrode; a second capacitor electrode on the interlayer insulator; a passivation layer formed on the interlayer insulator to cover the drain and source electrodes, the cathode electrode and the second capacitor electrode, the passivation layer having a bank that exposes the cathode electrode; an organic electroluminescent layer on the passivation layer and into the bank, the organic electroluminescent layer contacting the cathode electrode through the bank; and an anode electrode on the exposed portion of the passivation layer and on the organic electroluminescent layer.

In another aspect of the present invention, a fabricating method of an active matrix organic electroluminescent display device includes: forming a ground layer on a substrate; forming a buffer layer on the ground layer; forming a polycrystalline semiconductor layer on the buffer layer; forming a gate insulation layer on the buffer layer to cover the polycrystalline silicon layer; forming a gate electrode and a first capacitor electrode on the gate insulation layer, the gate electrode disposed right above the polycrystalline silicon layer; doping ions into the polycrystalline semiconductor layer using the gate electrode as a mask so that the polycrystalline semiconductor layer has an active region, a drain region and a source region, wherein the active region is disposed in the middle of the polycrystalline silicon layer right under the gate electrode and the drain and source regions are disposed in both sides of the active region; forming an interlayer insulator on the gate insulation layer to cover the gate electrode and the first capacitor electrode; forming first, second, third and fourth contact holes, wherein the first and second contact holes expose the drain and source regions, respectively, by penetrating both the interlayer insulator and the gate insulation layer, and the third and fourth contact holes expose portions of the ground layer by penetrating the interlayer insulator, the gate insulation layer and the buffer layer; forming drain and source electrodes on the interlayer insulator, the drain and source electrode contacting the drain and source regions, respectively, through the first contact hole and through the second contact hole; forming a cathode electrode on the interlayer insulator, the cathode electrode connected to the drain electrode; forming a second capacitor electrode on the interlayer insulator; forming a passivation layer on the interlayer insulator to cover the drain and source electrodes, the cathode electrode and the second capacitor electrode, the passivation layer having a bank that exposes the cathode electrode; forming an organic electroluminescent layer on the passivation layer and into the bank, the organic electroluminescent layer contacting the cathode electrode through the bank; and forming an anode electrode on the exposed portion of the passivation layer and on the organic electroluminescent layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings. Wherever possible, similar reference numbers will be used throughout the drawings to refer to the similar or like parts.

Figure 1:
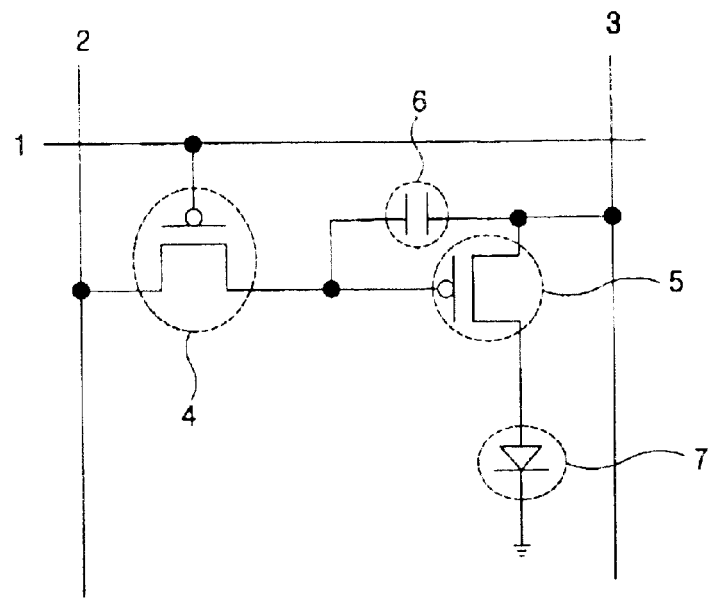
FIG. 1 is an equivalent circuit diagram showing a basic pixel structure of a related art active matrix organic electroluminescent display (ELD) device.
Figure 2:
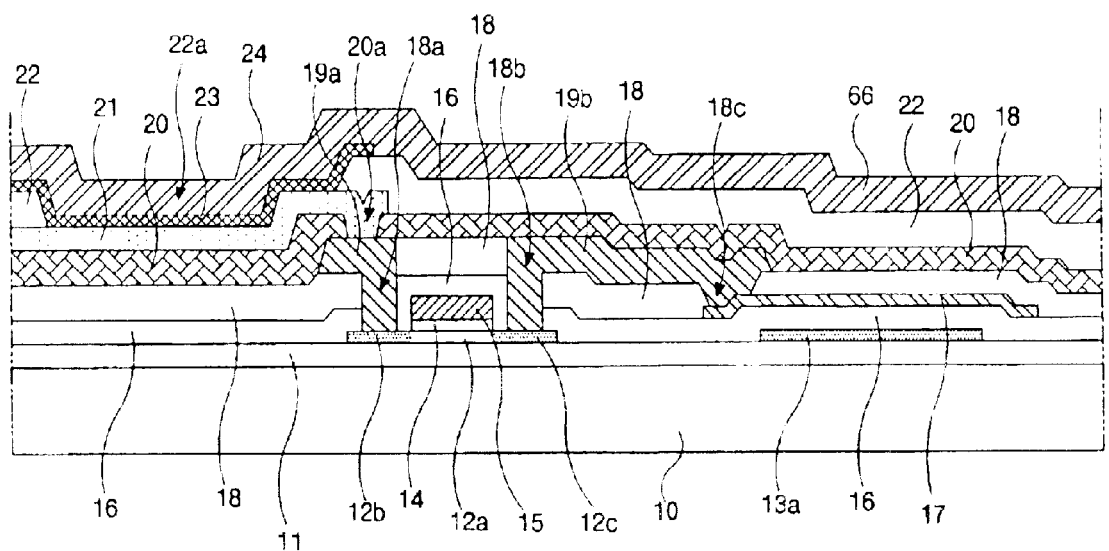
FIG. 2 is a schematic cross-sectional view of a related art active matrix organic electroluminescent display device.
Figure 3A:
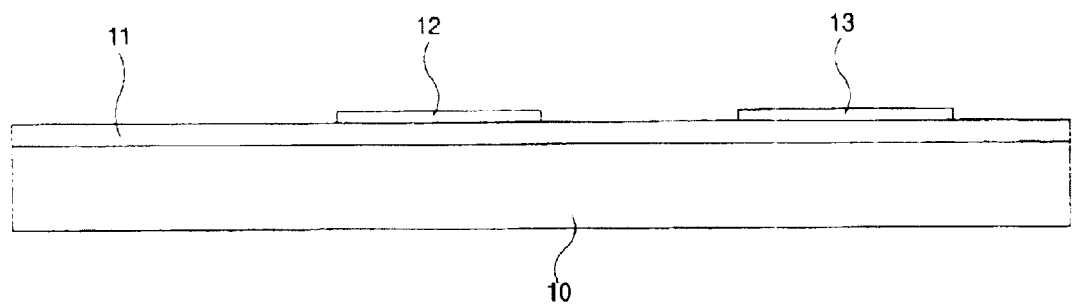
FIGS. 3A to 3I are cross-sectional views illustrating a fabricating process of an active matrix organic electro luminescent display device of FIG. 2.
Figure 3B:
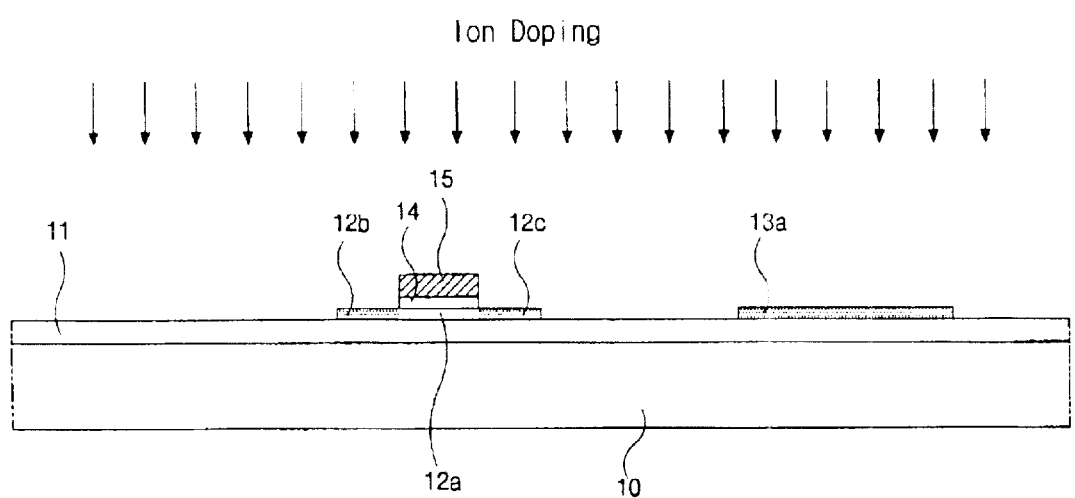
Figure 3C:
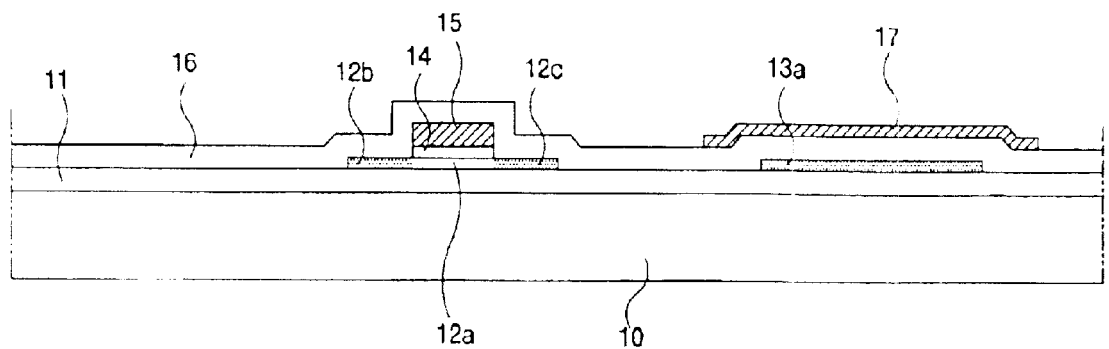
Figure 3D:
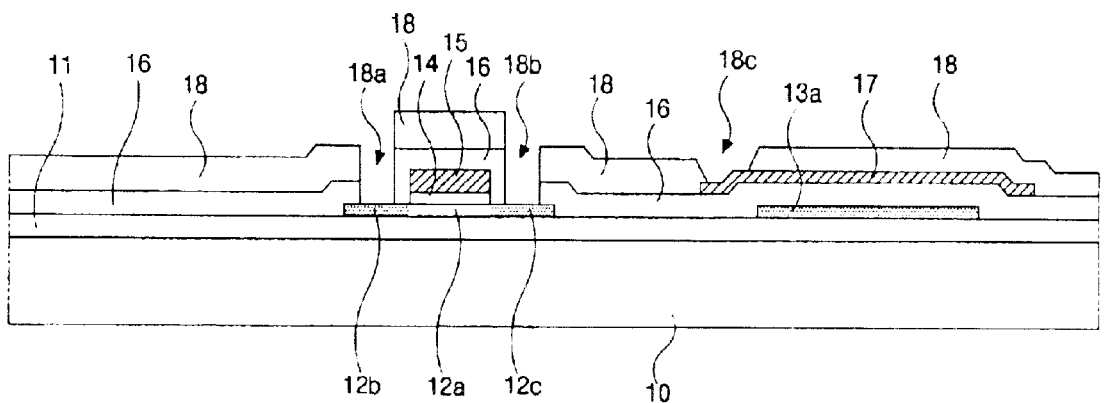
Figure 3E:
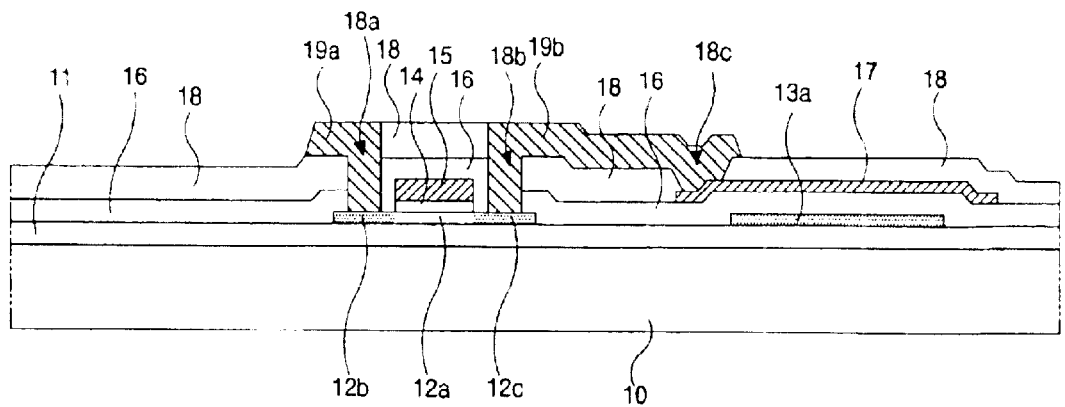
Figure 3F:
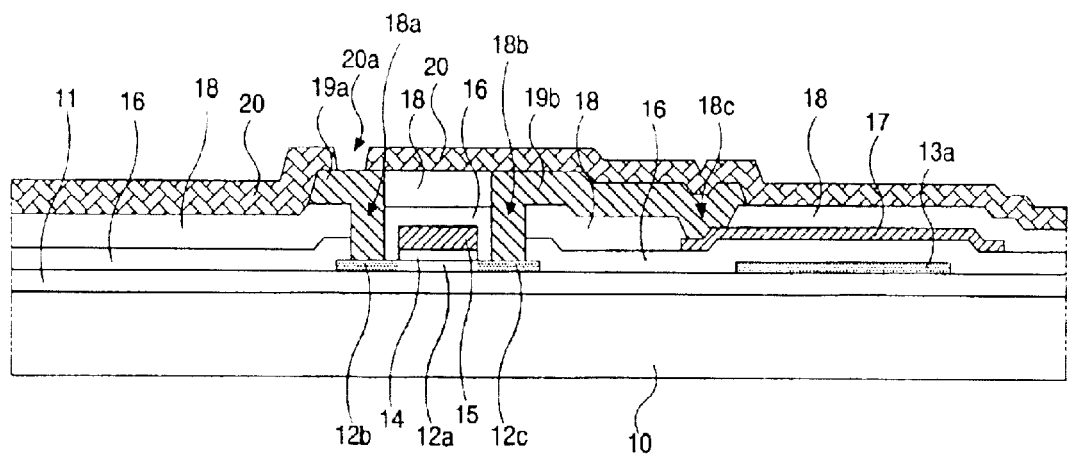
Figure 3G:
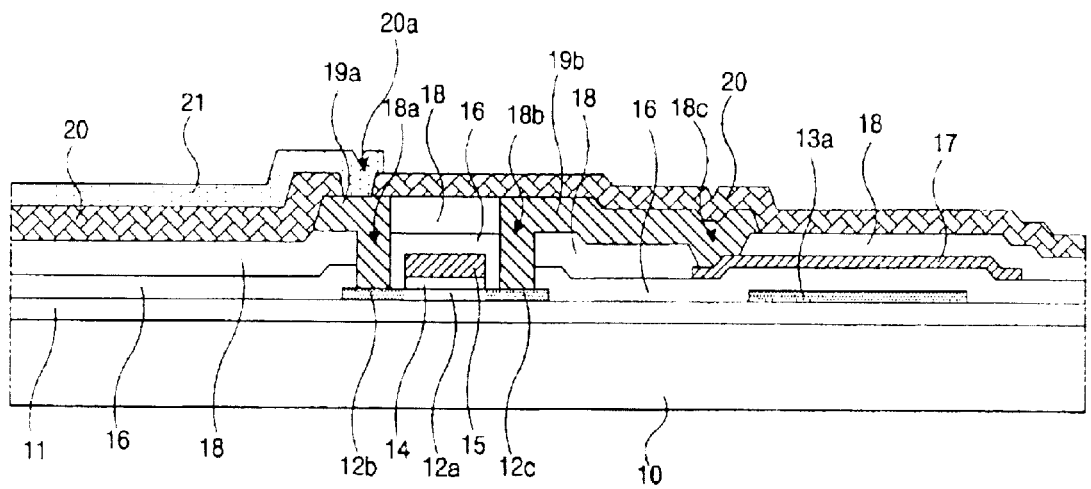
Figure 3H:
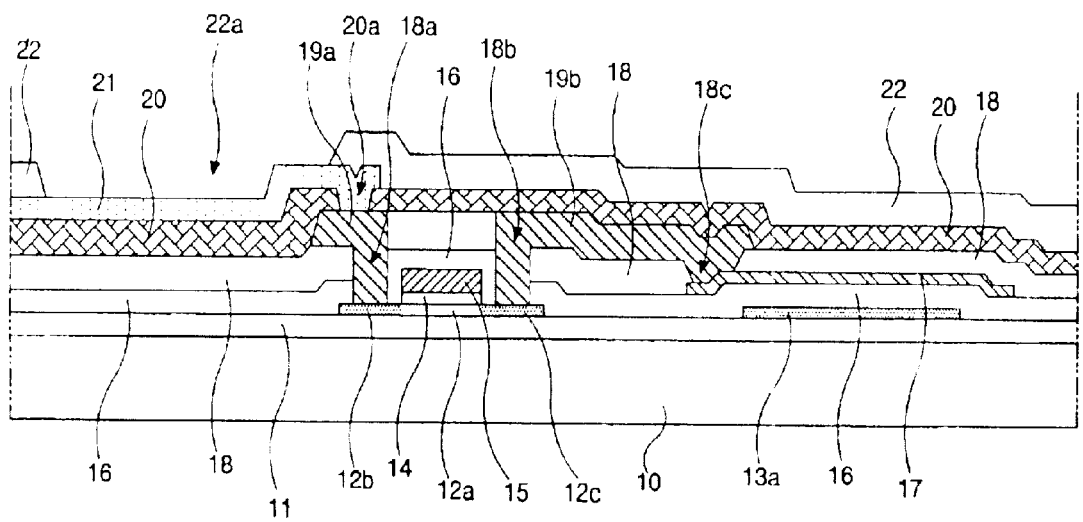
Figure 3I:
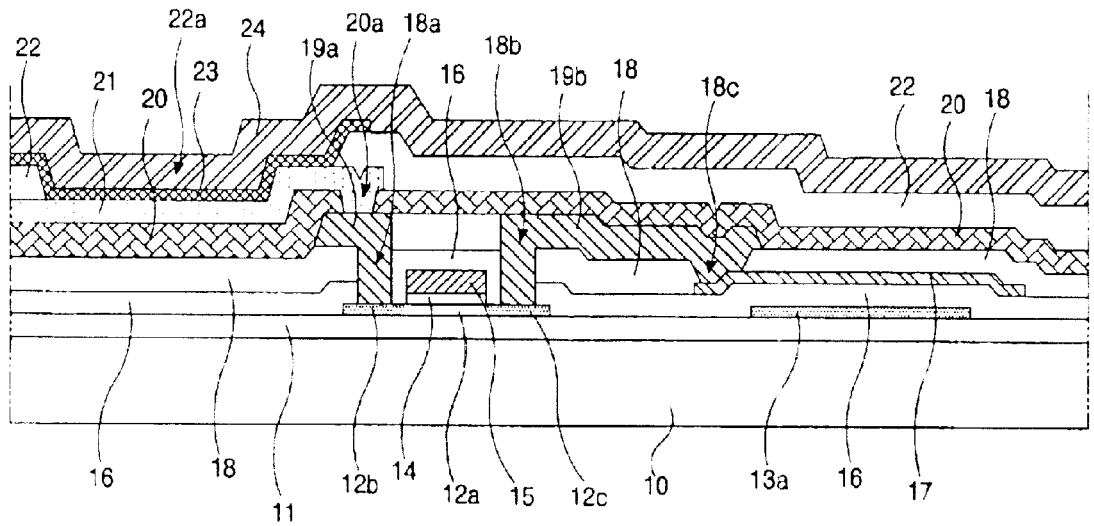
Figure 4:
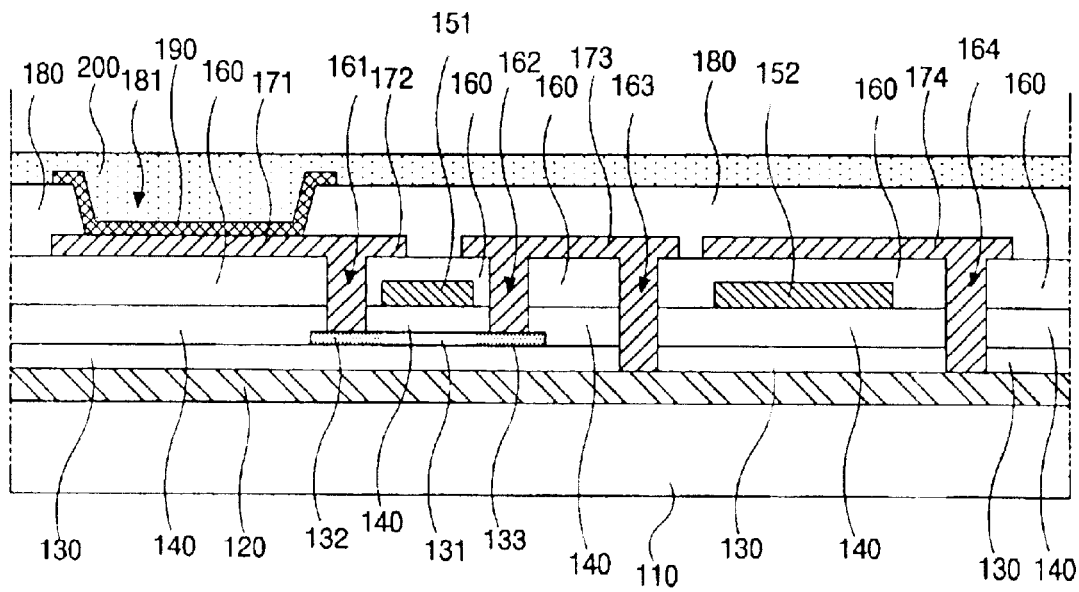
FIG. 4 is a schematic cross-sectional view of an active matrix organic electroluminescent display device according to an exemplary embodiment of the present invention.

FIG. 4 is a schematic cross-sectional view of an active matrix organic electroluminescent display device according to an exemplary embodiment of the present invention. Since the active matrix organic EL device uses a p-Si TFT, a top gate type is adopted.

In FIG. 4, a ground layer 120 is formed on entire surface of a substrate 110. The ground layer 120 is a conductive material, such as metal. A buffer layer 130 of silicon nitride or silicon oxide is formed on the ground layer 120. A semiconductor layer 131 (132 and 133) that is an island-shaped polycrystalline silicon is formed on the buffer layer 130. The polycrystalline semiconductor layer is divided into an active region 131 to which dopant is not applied and drain and source regions 132 and 133 to which the dopant is applied and doped. Here, the buffer layer 130 prevents that the impurities from the substrate 110 or the ground layer 120 from infiltrating into the polycrystalline semiconductor layer 131 (132 and 133). A gate insulation layer 140 is formed on the buffer layer 130 covering the active, drain and source regions 131, 132 and 133. A gate electrode 151 is formed on the gate insulation layer 140 above and overlapping the active region 131 of the polycrystalline semiconductor layer. The gate electrode 151 may be formed right above the active region 131. Further, a first capacitor electrode 152 that is made of the same material as the gate electrode 151 is formed on the gate insulation layer 140.

Still referring to FIG. 4, an interlayer insulator 160 is disposed on the gate insulation layer 140 covering the gate electrode 151 and the first capacitor electrode 152. Meanwhile, first and second contact holes 161 and 162, which penetrate both the interlayer insulator 160 and the gate insulation layer 140, expose the drain region 132 and source region 133, respectively. Additionally, third and fourth contact holes 163 and 164, which penetrate the interlayer insulator 160, gate insulation layer 140 and buffer layer 130, are formed and expose portions of the ground layer 120. A cathode electrode 171, a drain electrode 172, a source electrode 173 and a second capacitor electrode 174, which are made of an opaque conductive material, such as metal, are on the interlayer insulator 160. The cathode electrode 171 is connected to the drain electrode 172, which contacts the drain region 132 through the first contact hole 161. The source electrode 173 contacts both the drain region 133 and the ground layer 120, through the second contact hole 162 and through the third contact hole 163, respectively. The second capacitor electrode 174 contacts the ground line 120 through the fourth contact hole 164. The first and second capacitor electrodes 152 and 174 with the interposed interlayer insulator 160 form a storage capacitor. Although not shown in FIG. 4, the first capacitor electrode 152 is connected to the gate electrode 151 when viewed in a superficial observation. A passivation layer 180 is formed on the interlayer insulator 160 to cover the cathode electrode 171, the drain electrode 172, the source electrode 173 and the second capacitor electrode 174. The passivation layer 180 has a well 181 that exposes the cathode electrode 171. An electroluminescent layer 190 is formed on the passivation layer 180 and into the well 181 so that the electroluminescent layer 190 contacts the cathode electrode 171 through the well 181. An anode electrode 200 is formed on the electroluminescent layer 190 and on the passivation layer 180. The anode electrode 200 is a transparent conductive material, such as indium tin oxide or indium zinc oxide. The anode electrode 200 is disposed entirely over the substrate 110 so that the anode electrode 200 acts as a power line.

Figure 5:
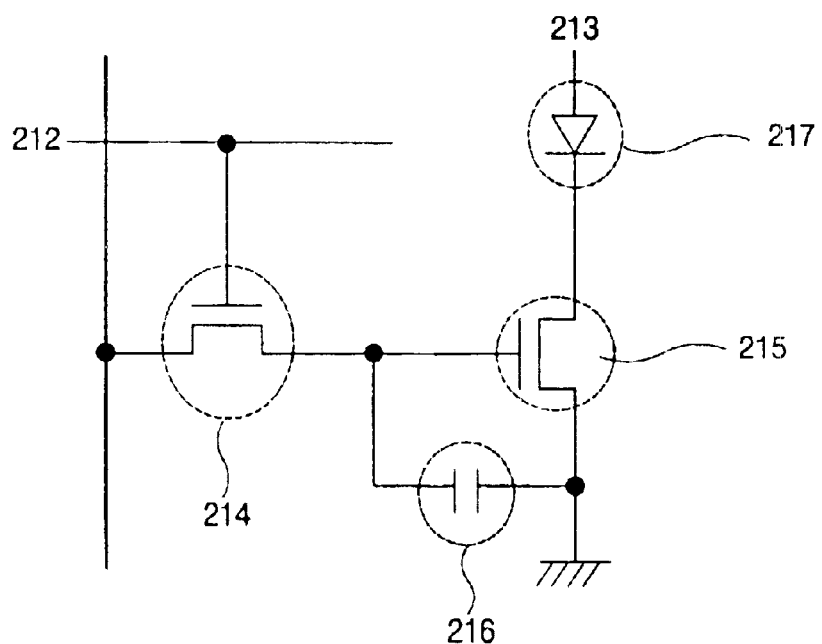
FIG. 5 is an equivalent circuit diagram showing a basic pixel structure of an active matrix organic electroluminescent display (ELD) device according to the present invention.

FIG. 5 is an equivalent circuit diagram illustrating a basic pixel structure of an active matrix organic electroluminescent display (ELD) device according to the present invention. As shown in FIG. 5, a gate line 212 is arranged in a first direction, and a data line 211 is arranged in a second direction substantially perpendicular to the first direction, thereby defining a pixel region. A switching thin film transistor (TFT) 214 is disposed near a crossing of the data and gate lines 211 and 212 and connected to the data and gate lines 211 and 212. The gate electrode of the switching TFT 214 is connected to the gate line 212, and the source electrode of the switching TFT 214 is connected to the data line 211. Furthermore, the switching TFT 214 is connected to both a driving thin film transistor (TFT) 215 and a storage capacitor 216. Namely, the drain electrode of the switching TFT 214 is connected to both the gate electrode of the driving TFT 215 and the capacitor electrode of the storage capacitor 216. The drain electrode of the driving TFT 215 is connected to a cathode electrode of a electroluminescent diode 217. The source electrode of the driving TFT 215 is grounded. The anode electrode of the electroluminescent diode 217 is connected to a power line 213. In order to uniformly maintain a gate voltage of the driving TFT 215, the storage capacitor 216 is connected to both the gate and source electrodes of the driving TFT 215.

In the active matrix organic electroluminescent display device shown in FIG. 5, it is advisable that the driving TFT 216 is an n-type thin film transistor. However, the switching TFT 215 can be either an n-type thin film transistor or a p-type thin film transistor.

Figure 6:
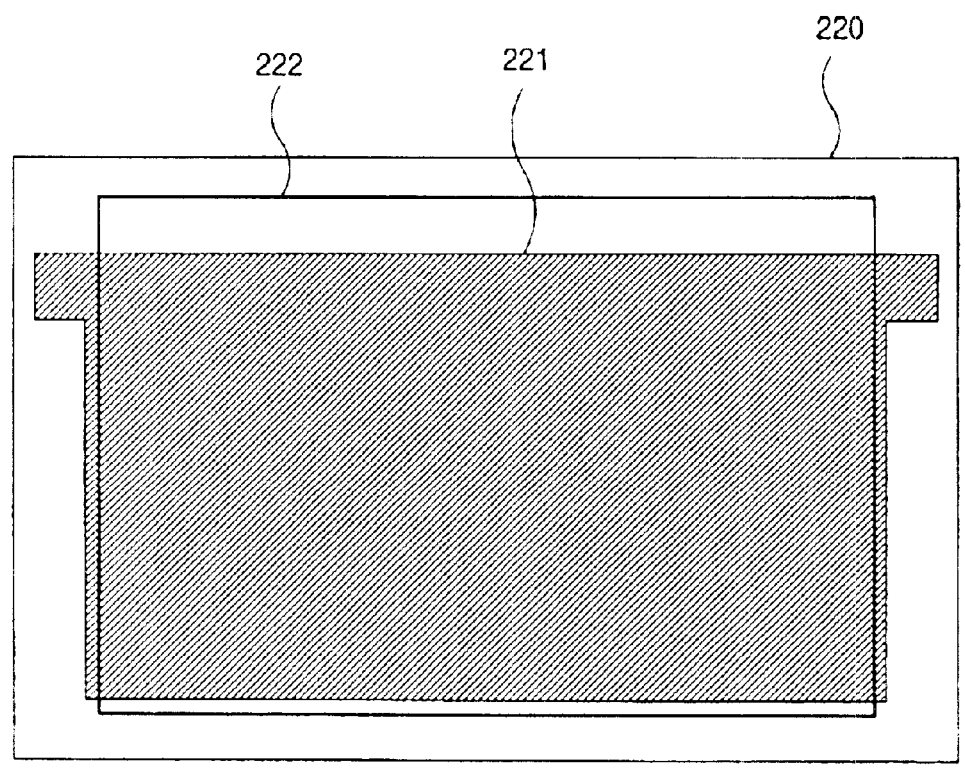
FIG. 6 is a plan view schematically illustrating a power line and a ground layer according to an exemplary embodiment of the present invention.

As described with reference to FIG. 4, the ground layer and the power-line layer are disposed all over the substrate. FIG. 6 is a plan view schematically illustrating the ground layer 212 and the power-line layer 222 according to an exemplary embodiment of the present invention. In FIG. 6, the thin film transistors and the storage capacitors are omitted for simple illustration.

As shown in FIG. 6, the ground line 221 and the power-line layer 222 are formed over the substrate 220. The ground layer 221 is disposed all over the substrate 220 with some portions thereof exposed. Additionally, the power-line layer 222 is also disposed all over the substrate 220 with some portions thereof exposed. The overlapped area of the ground line 221 and power-line layer 222 is a display region where the images appear, and thus a plurality of thin film transistors and a plurality of electroluminescent diodes are disposed in that display region. In the present invention, the power-line layer 222 acts as the anode electrode of the electroluminescent diode, as described before.

According to the present invention, since the ground layer and the power-line layer are formed all over the substrate, the resistance of the power line is reduced and thermal damage that may be caused in the power line during driving the device is prevented. Therefore, the image quality increases, and the uniformity in the display can be obtained.

In the first embodiment illustrated in FIG. 4, the cathode electrode is formed of opaque conductive material and the anode electrode is formed of transparent conductive material. Thus, the organic electroluminescent display device can be a top emission type in which the light is released in an upper direction. A high aperture ratio can be obtained. As a result, the luminance of the display device can increase even though the current density is not large. It is distinguishable in the present invention that the lifetime of the organic electroluminescent display device is lengthened.

FIGS. 7A to 7F are cross-sectional views illustrating a fabricating process of the active matrix organic electroluminescent display device of FIG. 4.

Figure 7A:
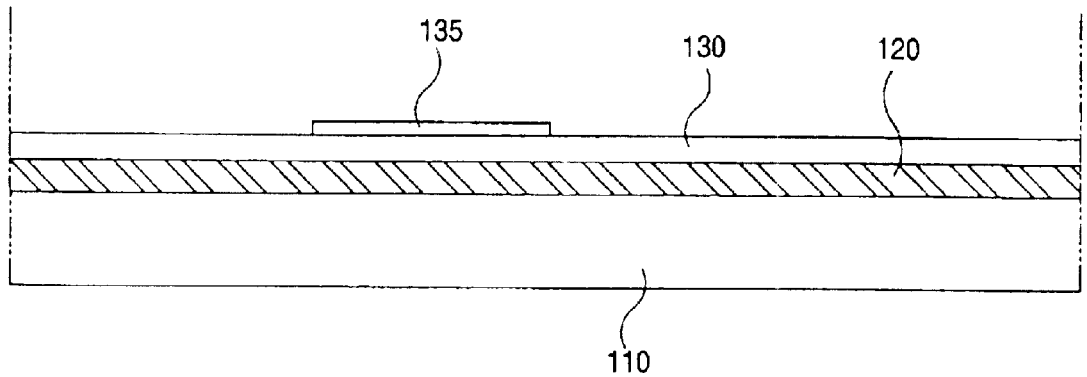
FIGS. 7A to 7F are cross-sectional views illustrating a fabricating process of an active matrix organic electroluminescent display device of FIG. 4.

In FIG. 7A, a conductive material, such as metal, is deposited on a substrate 110 and then patterned using a first mask process to form a ground line 120. When viewed in a superficial observation, the ground line 120 has the shape illustrated in FIG. 6 so that it is widely disposed over the substrate 110 and covers the display region where the images appear. Thereafter, a buffer layer 130 is formed on the ground line 120. The buffer layer 130 is one of silicon oxide and silicon nitride. Next, a polycrystalline silicon layer is formed on an entire surface of the buffer layer 130 and then patterned using a second mask process to form a semiconductor layer 135. There are many methods of forming of the polycrystalline silicon. One is forming an amorphous silicon layer on the buffer layer and then heat-treating the amorphous silicon to form the polycrystalline silicon. Another is that a laser irradiation is used to convert the amorphous silicon into the polycrystalline silicon. In the present invention, the substrate 110 can be a glass or other transparent substances.

Figure 7B:
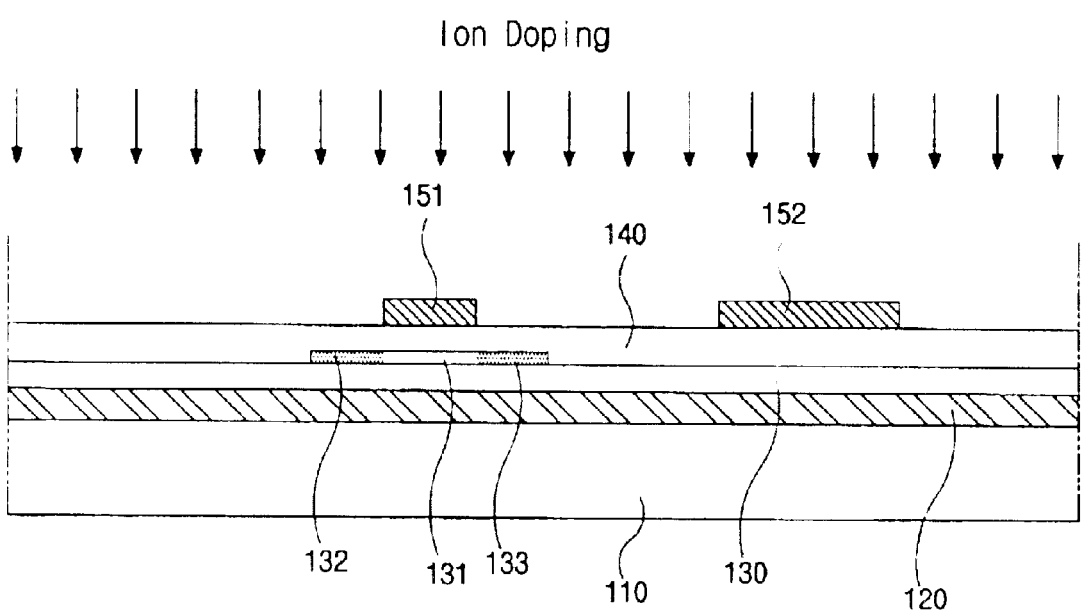

In FIG. 7B, a gate insulation layer 140 of silicon nitride or silicon oxide is formed on the buffer layer 130 to cover the semiconductor layer 135, and then a metallic material is deposited on the gate insulation layer 140. The deposited metallic material is patterned using a third mask process to form a gate electrode 151 and a first capacitor electrode 152. The gate electrode 151 is disposed above the semiconductor layer 135. Using the gate electrode 151 as a mask, the dopant (e.g., n-type ions) is applied to and doped on portions of the semiconductor layer 135. Thus, the semiconductor layer 135 is divided into an active region 131 in the middle and drain and source regions 132 and 133 on both sides of the active region 131. Because the gate electrode 151 acts as a mask during the doping process, the dopant does not exist in the active region 131, but only exists in the drain and source regions 132 and 133. Although not shown in FIG. 7B, the first capacitor electrode 152 is electrically connected to the gate electrode 151.

Figure 7C:
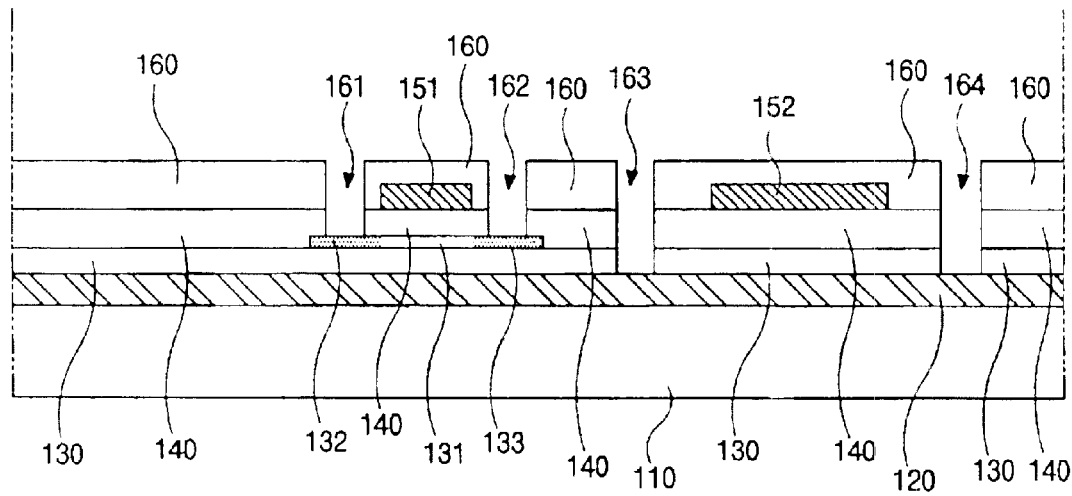

In FIG. 7C, an interlayer insulator 160 is formed on the gate insulation layer 140 to cover the gate electrode 151 and the first capacitor electrode 152. Thereafter, a fourth mask process is performed to form first to fourth contact holes 161, 162, 163 and 164. The first and second contact holes 161 and 162 penetrate both the interlayer insulator 160 and the gate insulation layer 140, and expose the drain region 132 and the source region 133, respectively. Additionally, the third and fourth contact holes 163 and 164 penetrate the interlayer insulator 160, the gate insulation layer 140 and the buffer layer 130 so that they expose portions of the ground layer 120. The interlayer insulator 160 may be made of an organic insulating material such as benzocyclobutene (BCB). In such case, the interlayer insulator 160 has a flat surface. Since the interlayer insulator 160 covers the buffer layer 130, which may have a poor surface roughness as stated above, the surface roughness of the buffer layer 130 does not have influence on other layers to be formed thereon. Thus, an electrode, which will be formed on the layers, is not affected by the surface roughness of the buffer layer 130.

Figure 7D:
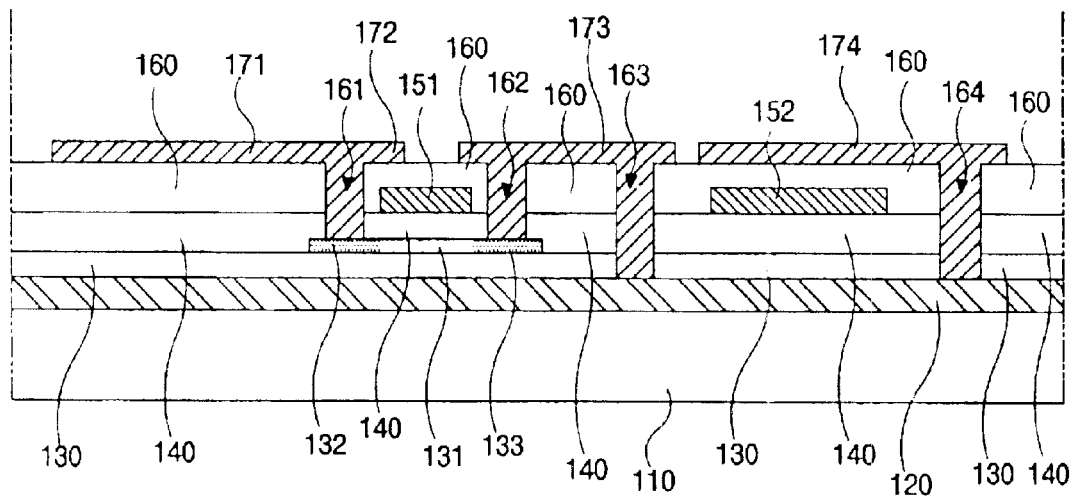

In FIG. 7D, a conductive material, such as metal, is deposited on the interlayer insulator 160 and then patterned using a fifth mask process so as to form a cathode electrode 171, a drain electrode 172, a source electrode 173 and a second capacitor electrode 174. The cathode electrode 171 is connected to the drain electrode 172 as shown in FIG. 7D. The drain electrode 172 contacts the drain region 132 through the first contact hole 161. The source electrode 173 contacts the source region 133 and the ground line 120 through the second contact hole 162 and through the third contact hole 163, respectively. Furthermore, the second capacitor electrode 174 contacts the ground line 120 through the fourth contact hole 164 and forms a storage capacitor with the first capacitor electrode 152 and with the interposed interlayer insulator 160.

Figure 7E:
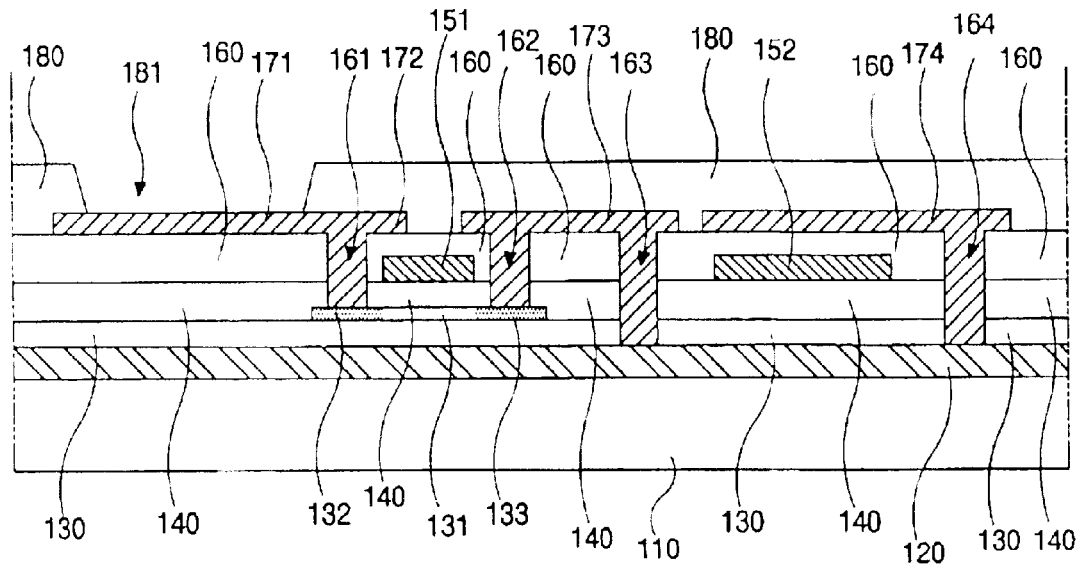

Now in FIG. 7E, a passivation layer 180 is formed on the patterned conductive layer and on the exposed portions of the interlayer insulator 160. Thus, the passivation layer 180 covers the cathode electrode 171, the drain electrode 172, the source electrode 173 and the second capacitor electrode 174. Thereafter, a portion of the passivation layer 180 is patterned through a sixth mask process, thereby resulting in a well 181 that exposes the cathode electrode 171.

Figure 7F:
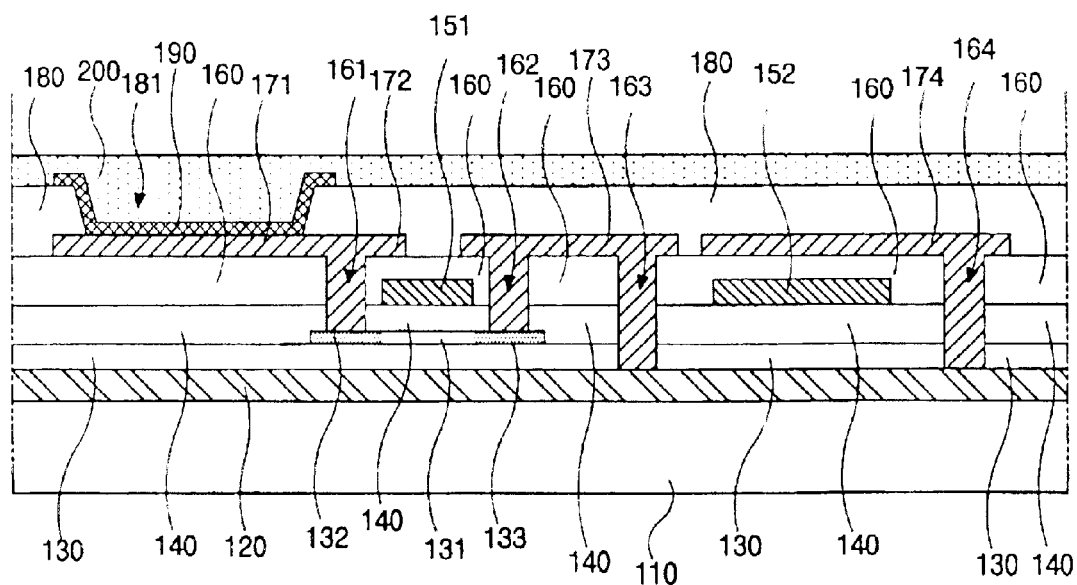

In FIG. 7F, an organic electroluminescent layer 190 is formed on the passivation layer 180 and on the exposed cathode electrode 171. The organic electroluminescent layer 190 contacts the cathode electrode 171 through the well 181. Thereafter, a transparent conductive material, such as indium tin oxide or indium zinc oxide, is formed on the organic electroluminescent layer 190 and on the passivation layer 180, thereby forming an anode electrode 200. At the time of forming the organic electroluminescent layer 190, an inkjet method or a shadow mask is used so that an additional mask process is not required. Furthermore, since the shadow mask is also used to form the anode electrode 200, the additional mask process is also not required.

As described with reference to FIGS. 7A to 7F, the active matrix organic electro luminescent display device of the present invention is fabricated through the first to sixth mask processes. Thus, the fabrication time and the cost of production are dramatically reduced as compared with the related art. Furthermore, it is possible that the defects of the layer elements are lessened because the reduction of the mask process. Accordingly, the fabrication yield increases in the present invention.

The active matrix organic electroluminescent display device shown in FIGS. 4 and 7A–7F is the top emission type. However, the principles of the present invention can be adopted in the bottom emission type device. The active matrix organic electroluminescent display device of the bottom emission type will be described in detail with reference to FIG. 8.

Figure 8:
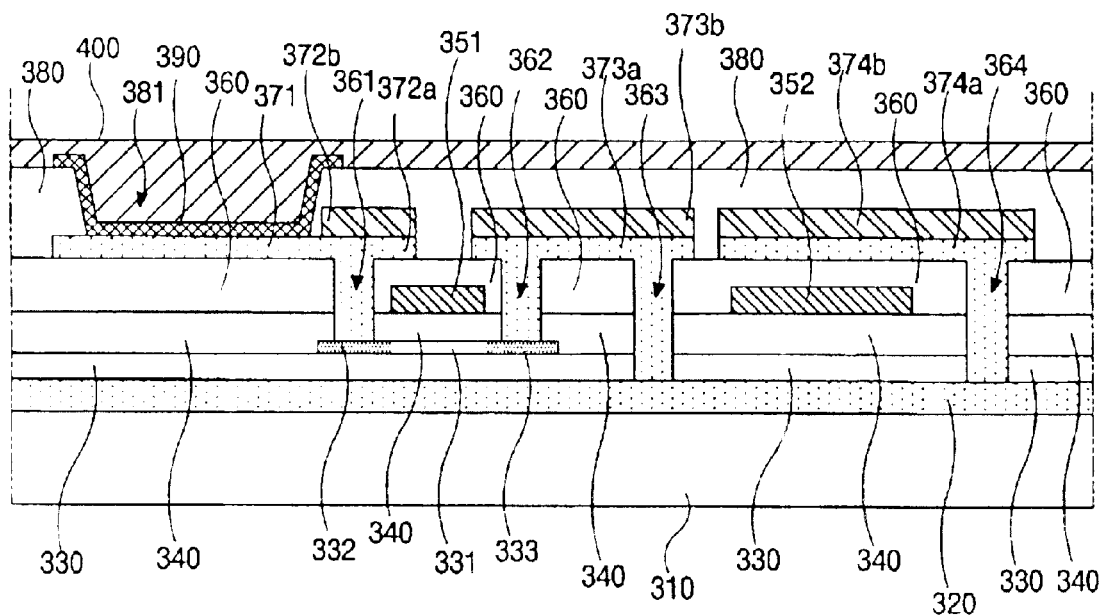
FIG. 8 is a schematic cross-sectional view of an active matrix organic electroluminescent display device according to another exemplary embodiment of the present invention.

FIG. 8 is a schematic cross-sectional view of an active matrix organic electro luminescent display device according to another exemplary embodiment of the present invention.

As shown in FIG. 8, a ground line 320 of a transparent conductive material is formed on all or substantially all of a substrate 310. The transparent conductive material is indium tin oxide (ITO) or indium zinc oxide (IZO), and the substrate 310 is substantially a glass, for example. On the ground line 320, the buffer layer 330 is formed. A semiconductor layer having an active region 331, drain region 332 and source region 333 is formed on the buffer layer 330. The semiconductor layer is formed of polycrystalline silicon and shaped like an island. The active layer 331 is a pure silicon region to which no dopant is applied. The drain and source regions 332 and 333 disposed on both sides of the active layer 331 are impurity-doped regions to which the dopant is applied and doped.

Thereafter, a gate insulation layer 340 is formed on the buffer layer 330 covering the active, drain and source regions 331, 332 and 333. A gate electrode 351 is formed on the gate insulation layer 340 above the active region 331 of the polycrystalline semiconductor layer. The gate electrode 351 may be formed right above the active region 331. Further, a first capacitor electrode 352 that is made of the same material as the gate electrode 351 is formed on the gate insulation layer 340. Although not shown in FIG. 8, the gate electrode 351 and the first capacitor electrode 352 are electrically connected to each other. Next, an interlayer insulator 360 is disposed on the gate insulation layer 340 covering the gate electrode 351 and the first capacitor electrode 352. The interlayer insulator 360 is made of an organic insulating material and planarites the surface of the substrate 310, including the gate electrode 351. Since the interlayer insulator 360 covers the buffer layer 330, which may have a poor surface roughness, the surface roughness of the buffer layer 330 does not have influence on other layers to be formed thereon. Thus an electrode, which will be formed on the layers, is not affected by the surface roughness of the buffer layer 330. The interlayer insulator 360 may include benzocyclobutene (BCB).

Meanwhile, first and second contact holes 361 and 362, which penetrate both the interlayer insulator 360 and the gate insulation layer 340, are formed to expose the drain region 332 and source region 333, respectively. Additionally, third and fourth contact holes 363 and 364, which penetrate the interlayer insulator 360, gate insulation layer 340 and buffer layer 330, are formed with the first and second contact holes 361 and 362 to expose portions of the ground layer 320. A cathode electrode 371, a drain electrode 372, a source electrode 373 and a second capacitor electrode 374 are formed on the interlayer insulator 360. The cathode electrode 371 has a single-layered structure, while the drain electrode 372, the source electrode 373 and the second capacitor electrode 374 may have a double-layered structure. The cathode electrode 371 is made of a transparent conductive material, such as indium tin oxide (ITO) or indium zinc oxide (IZO), for example. Further, the lower part 372a of the drain electrode 372, the lower part 373a of the source electrode 373 and the lower part 374a of the second capacitor electrode 374 are also made of the transparent conductive material, for example, indium tin oxide (ITO) or indium zinc oxide (IZO). On the contrary, the upper part 372b of the drain electrode 372, the upper part 373b of the source electrode 373 and the upper part 374b of the second capacitor electrode 374 are made of an opaque conductive material, such as metal, for example. The cathode electrode 371 is connected to the lower part 372a of the double-layered drain electrode 372, which contacts the drain region 332 through the first contact hole 361. The lower part 373a of the source electrode 373 contacts both the drain region 333 and the ground layer 320 through the second contact hole 362 and through the third contact hole 363, respectively. The lower part 374a of the second capacitor electrode 374 contacts the ground line 320 through the fourth contact hole 364. The first and second capacitor electrodes 352 and 374 with the interposed interlayer insulator 360 form a storage capacitor.

Next, a passivation layer 380 is formed on the interlayer insulator 360 to cover the cathode electrode 371, the drain electrode 372, the source electrode 373 and the second capacitor electrode 374. The passivation 380 has a well 381 that exposes the cathode electrode 371. An electroluminescent layer 390 is then formed on the passivation layer 380 and into the well 381 so that the electroluminescent layer 390 contacts the cathode electrode 371 through the well 381. An anode electrode 400 is formed on the electroluminescent layer 390 and on the passivation layer 380. Here, it is distinguishable that the anode electrode 400 is formed of an opaque conductive material, such as metal, for example. The anode electrode 400 is disposed over all or substantially all the substrate 310 so that the anode electrode 400 acts as a power line.

In the exemplary example of the organic electroluminescent display device shown in FIG. 8, the ground layer 320 and the power-line anode layer 400 are formed all over the substrate 310. Thus, the resistance of the power line is reduced and thermal damage that may occur in the power line during driving the device is prevented. Therefore, the image quality increases and the uniformity in the display can be obtained. Moreover, since the ground line 320 and the cathode electrode 371 are made of the transparent conductive layer and the anode electrode 400 acting as the power line is made of the opaque conductive material, the active matrix organic electroluminescent display device of FIG. 8 becomes the bottom emission type in which the light is released in the bottom direction.

When fabricating the active matrix organic electroluminescent display device, a six-mask process can be adopted as in the first embodiment of FIGS. 7A to 7F. In order to use only six masks in the fabrication of the device shown in FIG. 8, the double layers of the transparent conductive material and the opaque conductive material are sequentially formed on the interlayer insulator 360. Thereafter, an exposure process is conducted using a special mask that has a slit in a portion for the cathode electrode 371. Thus, the six-mask process is available even though the drain and source electrodes 372 and 373 and the second capacitor electrode 374 have the double-layered structure.

Figure 9:
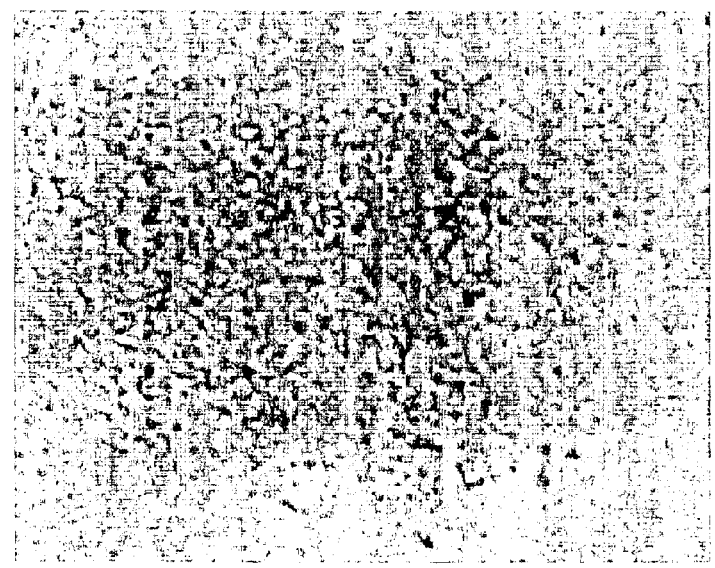
FIG. 9 is a photo showing a polycrystalline silicon layer that is formed above the ground layer shown in FIG. 6.

Meanwhile, the polycrystalline semiconductor layer having the active, drain and source regions are formed by applying heat or a laser beam to the deposited amorphous silicon layer. However, since the ground layer is disposed on the entire of the substrate and then the amorphous silicon layer is formed above the ground layer in the above-mentioned structures, the amorphous silicon layer is not properly crystallized due to the fact that the applied heat for crystallization is dispersed by ground layer having high thermal conductivity. This heat dispersion phenomenon induces the long crystallization time and inappropriate polycrystalline silicon. The polycrystalline silicon layer formed right above the ground layer is shown in FIG. 9. As shown in FIG. 9, the grains of the polycrystalline silicon are relatively small, so that the thin film transistor having these small grain sizes does not have good electrical properties and characteristics. Specifically, when using the laser beam for crystallization, the crystallization becomes worse because the light energy of the laser beam more easily disperses through the ground layer.

Figure 10:
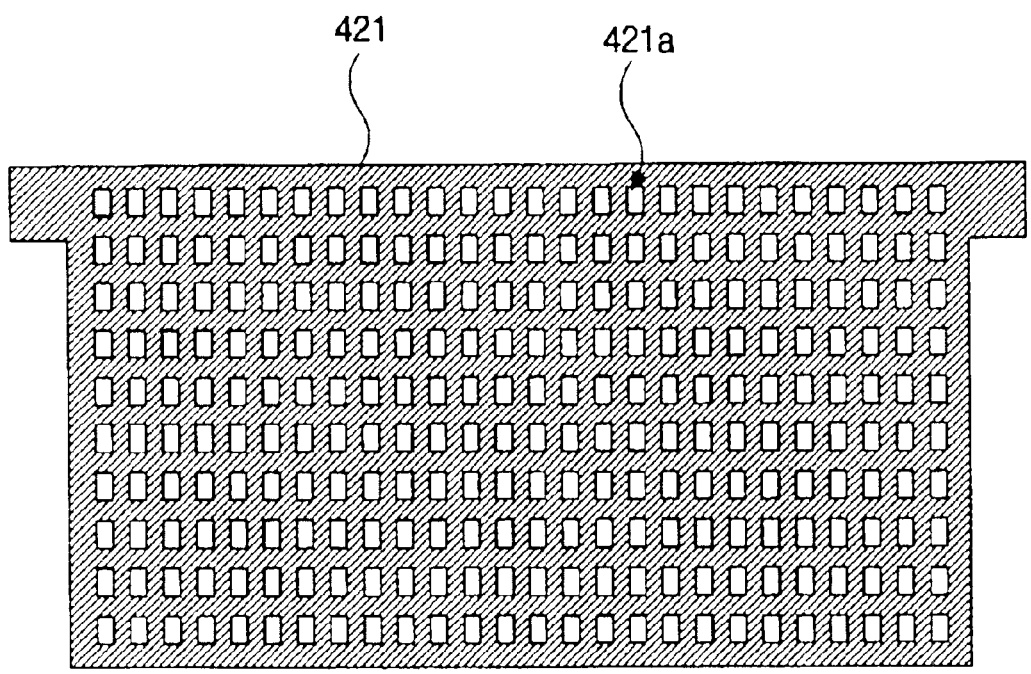
FIG. 10 is a plan view schematically illustrating a ground layer according to another exemplary embodiment of the present invention.

Therefore, to overcome this problem of thermal or light energy dispersion, another embodiment of the present invention provides a ground layer that has a plurality of openings each corresponding in position to the semiconductor layer. The ground layer having the plurality of openings is illustrated in FIG. 10. The ground layer 421 has the plurality of openings 421a therein in a row-and-column formation. Each opening 421a corresponds to the thin film transistor, especially to the semiconductor layer having the active, drain and source regions. When using the ground layer 421 of FIG. 10, the semiconductor layer of polycrystalline silicon can have the large grains.

Figure 11:
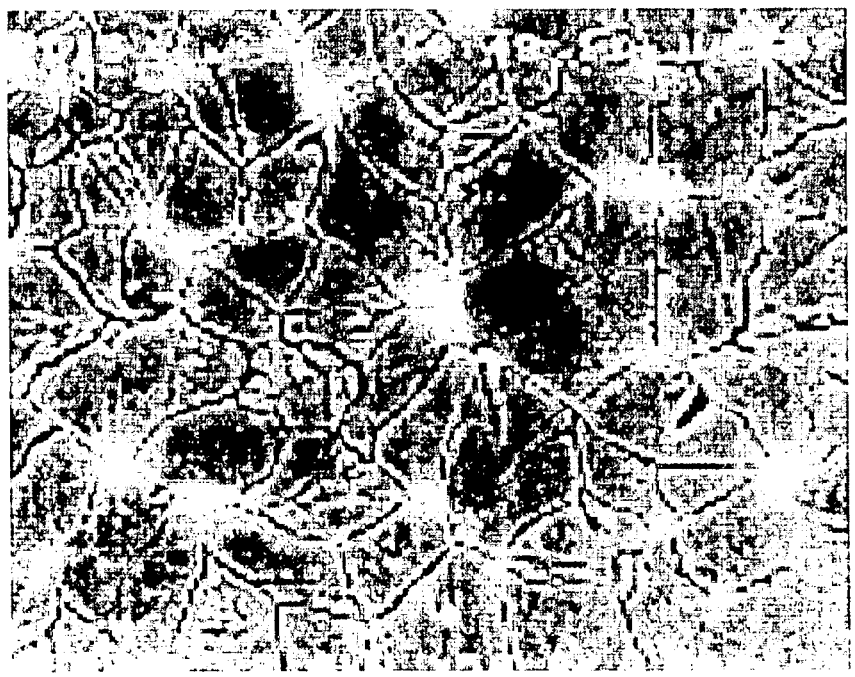
FIG. 11 is a photo showing a polycrystalline silicon layer that is formed above the ground layer shown in FIG. 10.

FIG. 11 is a photo showing the polycrystalline silicon layer that is formed above the ground layer shown in FIG. 10. Due to the opening 421a of the ground layer 421, the amorphous silicon is not deprived of the thermal or light energy when the amorphous silicon is crystallized. Thus, the grains of polycrystalline semiconductor layer become larger, as shown in FIG. 11. The thin film transistor having this large-sized polycrystalline silicon semiconductor layer can have the good electrical properties and characteristics.

The illustrated embodiments of the present invention have the following advantages.

First, since the ground line and the power line are entirely disposed above the substrate, the resistance of the power line is reduced and the thermal damage that may occur in the power line during driving the device is prevented. Therefore, the image quality increases and the uniformity in the display can be obtained.

Second, since the cathode electrode are formed with the drain and source electrode at the same time, the fabrication process can be reduced and the cost of production is lowered. Further, the defects occurrence is reduced due to the process reduction, and the production yield can be raised.

Third, the principle of the present invention can be applied to either the top emission type organic electroluminescent display device or the bottom emission type organic electroluminescent display device. When it is utilized for the top emission type, the active matrix organic electroluminescent display device can have a high aperture ratio.

Fourth, the interlayer insulator between the gate line and the data line is made of an organic material and planarites the surface of substrate including the gate line. Therefore, a uniform electric field is induced between the anode electrode and the cathode electrode, and gray scale of images is improved and the lifetime of the device increases.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescent device, comprising:

a substrate;

a ground layer on the substrate;

a buffer layer on the ground layer;

a polycrystalline semiconductor layer on the buffer layer, the polycrystalline semiconductor layer having an active region, a drain region and a source region, wherein the active region is disposed in the middle of the polycrystalline silicon layer and the drain and source regions are disposed to both sides of the active region;

a gate insulation layer on the buffer layer to cover the polycrystalline silicon layer;

a gate electrode on the gate insulation layer, the gate electrode above the active region of the polycrystalline silicon layer;

a first capacitor electrode on the gate insulation layer;

an interlayer insulator made of an organic material on the gate insulation layer covering the gate electrode and the first capacitor electrode;

drain and source electrodes on the interlayer insulator, the drain and source electrodes contacting the drain and source regions through first and second contact holes that penetrate the interlayer insulator and the gate insulation layer, respectively a cathode electrode on the interlayer insulator and connected to the drain electrode;

a second capacitor electrode on the interlayer insulator, the second capacitor electrode being electrically connected to the ground layer;

a passivation layer on the interlayer insulator covering the drain and source electrodes, the cathode electrode and the second capacitor electrode, the passivation layer having a well that exposes the cathode electrode;

an organic electroluminescent layer on the passivation layer and into the well, the organic electroluminescent layer contacting the cathode electrode through the well; and an anode electrode on the exposed portion of the passivation layer and on the organic electroluminescent layer.

2. The device according to claim 1, wherein the gate electrode is electrically connected to the first capacitor electrode.

3. The device according to claim 2, wherein the gate electrode and the first capacitor electrode are of the same material.

4. The device according to claim 1, wherein the source electrode contacts the ground line through a third contact hole that penetrates the interlayer insulator, the gate insulation layer and the buffer layer to expose a portion of the ground layer.

5. The device according to claim 1, wherein the second capacitor electrode contacts the ground line through a fourth contact hole that penetrates the interlayer insulator, the gate insulation layer and the buffer layer to expose a portion of the ground layer.

6. The device according to claim 1, wherein the anode electrode is disposed over substantially all the substrate and acts as a power line.

7. The device according to claim 1, wherein the first and second capacitor electrodes with the interlayer insulator layer interposed therebetween forms a storage capacitor.

8. The device according to claim 1, wherein the drain and source regions of the polycrystalline semiconductor layer are doped with ions, and the active region is pure silicon.

9. The device according to claim 1, wherein the ground layer has a plurality of openings each corresponding in position to the polycrystalline semiconductor layer.

10. The device according to claim 1, wherein the ground layer includes an opaque conductive material.

11. The device according to claim 10, wherein the opaque conductive material is metal.

12. The device according to claim 10, wherein the cathode electrode, the drain electrode the source electrode and the second capacitor electrode include the same material as the opaque conductive material.

13. The device according to claim 12, wherein the opaque conductive material is metal.

14. The device according to claim 10, wherein the anode electrode includes a transparent conductive material.

15. The device according to claim 14, wherein the transparent conductive material includes one of indium tin oxide and indium zinc oxide.

16. The device according to claim 1, wherein the ground layer includes a transparent conductive material.

17. The device according to claim 16, wherein the transparent conductive material is one of indium tin oxide and indium zinc oxide.

18. The device according to claim 16, wherein the cathode electrode includes a transparent conductive material.

19. The device according to claim 18, wherein the transparent conductive material is one of indium tin oxide and indium zinc oxide.

20. The device according to claim 16, wherein the anode electrode includes of an opaque conductive material.

21. The device according to claim 20, wherein the opaque conductive material is metal.

22. The device according to claim 16, wherein the drain electrode, the source electrode and the second capacitor electrode have a double-layered structure of a transparent conductive material and an opaque conductive material.

23. The device according to claim 22, wherein the transparent conductive material includes one of indium tin oxide and indium zinc oxide, and the opaque conductive material includes metal.

24. The device according to claim 1, wherein the interlayer insulator includes benzocyclobutene.

25. The device according to claim 1, wherein the gate electrode is right above the active region.

* * * * *